US012575464B2

(12) United States Patent
Lan et al.

(10) Patent No.: US 12,575,464 B2
(45) Date of Patent: Mar. 10, 2026

(54) METHOD OF FORMING WAFER-TO-WAFER BONDING STRUCTURE

(71) Applicant: Taiwan Semiconductor Manufacturing Company, Ltd., Hsinchu (TW)

(72) Inventors: Wen-Ting Lan, Hsinchu (TW); I-Han Huang, New Taipei (TW); Fu-Cheng Chang, Hsinchu (TW); Lin-Yu Huang, Hsinchu (TW); Shi-Ning Ju, Hsinchu (TW); Kuo-Cheng Chiang, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 714 days.

(21) Appl. No.: 17/816,055

(22) Filed: Jul. 29, 2022

(65) Prior Publication Data

US 2024/0038719 A1 Feb. 1, 2024

(51) Int. Cl.
*H01L 23/00* (2006.01)
*H01L 21/02* (2006.01)
(Continued)

(52) U.S. Cl.
CPC .......... *H01L 24/83* (2013.01); *H01L 21/0245* (2013.01); *H01L 21/26533* (2013.01);
(Continued)

(58) Field of Classification Search
CPC ......... H01L 21/76254; H01L 21/76898; H01L 23/481; H01L 25/0657; H01L 25/50;

H01L 2221/68368; H01L 2224/32145; H01L 2224/8313; H01L 2225/06541; H01L 2225/06558; H01L 2924/15311; H01L 24/03; H01L 21/7806; H10D 86/201; H10D 88/00; H10D 88/101; H10D 89/10
See application file for complete search history.

(56) References Cited

U.S. PATENT DOCUMENTS

2015/0145144 A1* 5/2015 McDonald ........ H01L 21/76831
257/774
2015/0329351 A1* 11/2015 Cheng .................... B81B 7/007
438/51
(Continued)

*Primary Examiner* — Julio J Maldonado
*Assistant Examiner* — Nathan Pridemore
(74) *Attorney, Agent, or Firm* — McClure, Qualey & Rodack, LLP

(57) ABSTRACT

A method of forming a semiconductor structure is provided. Two wafers are first bonded by oxide bonding. Next, the thickness of a first wafer is reduced using an ion implantation and separation approach, and a second wafer is thinned by using a removal process. First devices are formed on the first wafer, and a carrier is then attached over the first wafer, and an alignment process is performed from the bottom of the second wafer to align active regions of the second wafer for placement of the second devices with active regions of the first wafer for placement of the first devices. The second devices are then formed in the active regions of the second wafer. Furthermore, a via structure is formed through the first wafer, the second wafer and the insulation layer therebetween to connect the first and second devices on the two sides of the insulation layer.

20 Claims, 18 Drawing Sheets

(51) Int. Cl.

| | | |
|---|---|---|
| *H01L 21/265* | (2006.01) | |
| *H01L 21/48* | (2006.01) | |
| *H01L 23/498* | (2006.01) | |
| *H01L 23/538* | (2006.01) | |
| *H01L 25/065* | (2023.01) | |

(52) U.S. Cl.

CPC .. *H01L 23/49816* (2013.01); *H01L 23/49822* (2013.01); *H01L 23/49838* (2013.01); *H01L 23/49894* (2013.01); *H01L 23/5386* (2013.01); *H01L 23/5389* (2013.01); *H01L 24/16* (2013.01); *H01L 24/29* (2013.01); *H01L 24/32* (2013.01); *H01L 25/0657* (2013.01); *H01L 21/4857* (2013.01); *H01L 2224/16227* (2013.01); *H01L 2224/29187* (2013.01); *H01L 2224/32145* (2013.01); *H01L 2224/83005* (2013.01); *H01L 2224/83123* (2013.01); *H01L 2224/8313* (2013.01); *H01L 2224/8383* (2013.01); *H01L 2225/06517* (2013.01); *H01L 2225/06524* (2013.01); *H01L 2225/06541* (2013.01); *H01L 2225/06593* (2013.01); *H01L 2924/37001* (2013.01)

(56) References Cited

U.S. PATENT DOCUMENTS

| | | | | |
|---|---|---|---|---|
| 2015/0348945 A1* | 12/2015 | Or-Bach | ............... | H01L 23/481 |
| | | | | 257/384 |
| 2016/0020170 A1* | 1/2016 | Ho | ................... | H01L 21/76805 |
| | | | | 257/774 |
| 2017/0025307 A1* | 1/2017 | Ries | ........................ | H01L 24/83 |
| 2018/0061766 A1* | 3/2018 | Goktepeli | ......... | H01L 21/76898 |
| 2021/0183803 A1* | 6/2021 | Bayless | ................... | H01L 25/50 |

* cited by examiner

300

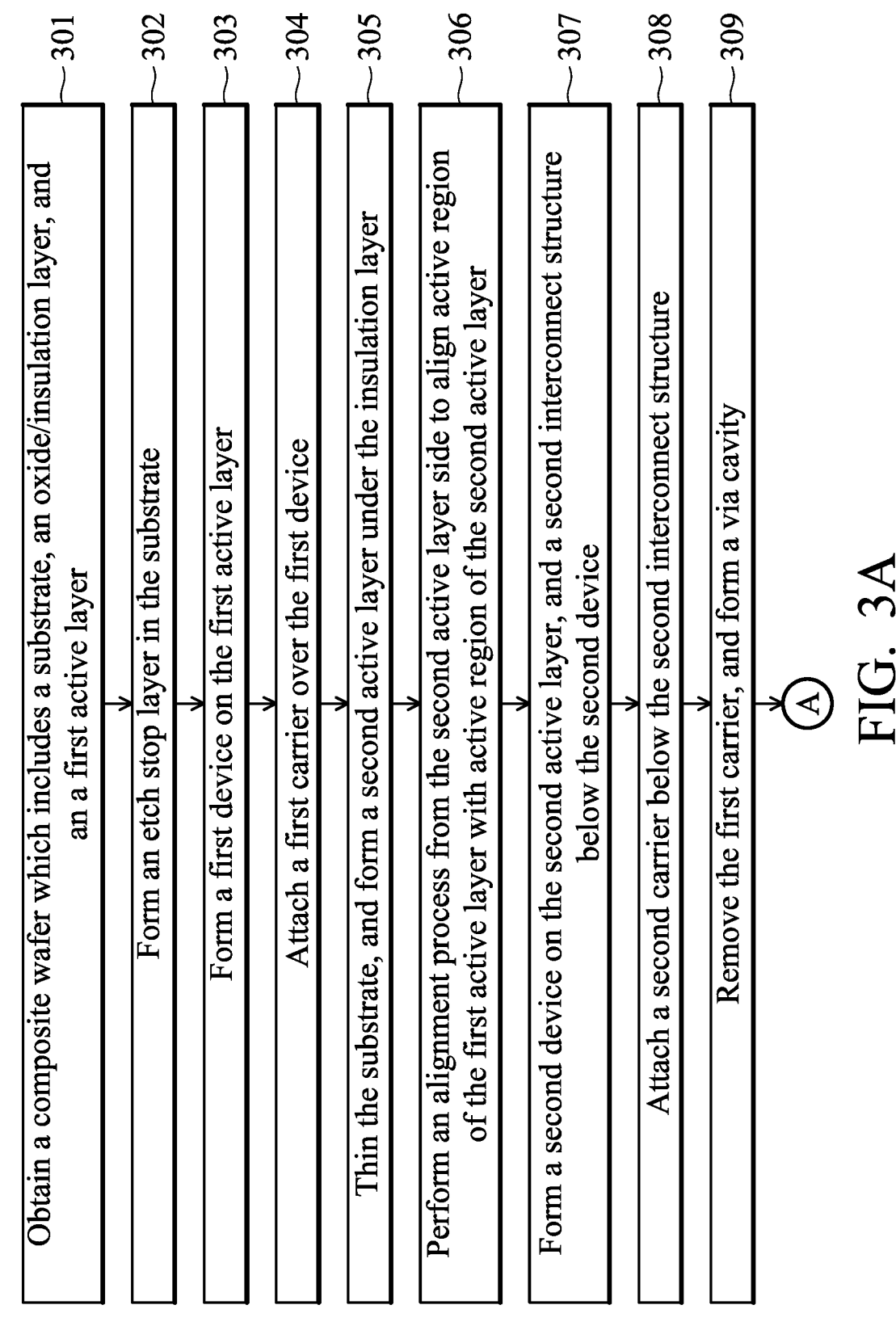

301 — Obtain a composite wafer which includes a substrate, an oxide/insulation layer, and an a first active layer 302 — Form an etch stop layer in the substrate 303 — Form a first device on the first active layer 304 — Attach a first carrier over the first device 305 — Thin the substrate, and form a second active layer under the insulation layer 306 — Perform an alignment process from the second active layer side to align active region of the first active layer with active region of the second active layer 307 — Form a second device on the second active layer, and a second interconnect structure below the second device 308 — Attach a second carrier below the second interconnect structure 309 — Remove the first carrier, and form a via cavity

Fill the via cavity with metal material to form via structure ~310

Form a first interconnect structure over the first device ~311

Form UBMs and conductive connectors over the first interconnect structure ~312

Remove the second carrier ~313

METHOD OF FORMING WAFER-TO-WAFER BONDING STRUCTURE

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

In an attempt to further increase circuit density, three-dimensional integrated circuits (3DICs) have been studied extensively. As a 3D packaging technique, wafer-to-wafer bonding (also called wafer-on-wafer stacking) is increasingly used to provide increased integration by forming vertical stacks of semiconductor devices without the need for intervening structures such as substrates or circuit boards. By bonding wafers directly, a single packaged integrated circuit may be produced which includes two or more wafer layers, providing increased system on a chip capabilities. Compared with other packaging techniques, wafer-to-wafer bonding has more advantages, including expanding IC dimensions, reducing power consumption, lowering costs, improving reliability and test quality, and having a high yield.

Previously known wafer-to-wafer bonding approaches include oxide bonding or fusion bonding, metal-to-metal bonding using thermo-compression bonding at higher pressure and high temperatures, and hybrid bonding that combines oxide bonding and metal-to-metal bonding. Although these existing wafer-to-wafer bonding approaches have generally been adequate for their intended purposes, they have not been entirely satisfactory in all respects. Therefore, there is still a need for an improved wafer-to-wafer bonding method.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A to 3B is a simplified flowchart illustrating a method for forming a wafer-to-wafer bonding structure in accordance with some embodiments of the present disclosure.

DETAILED DESCRIPTION

Figure 1A:
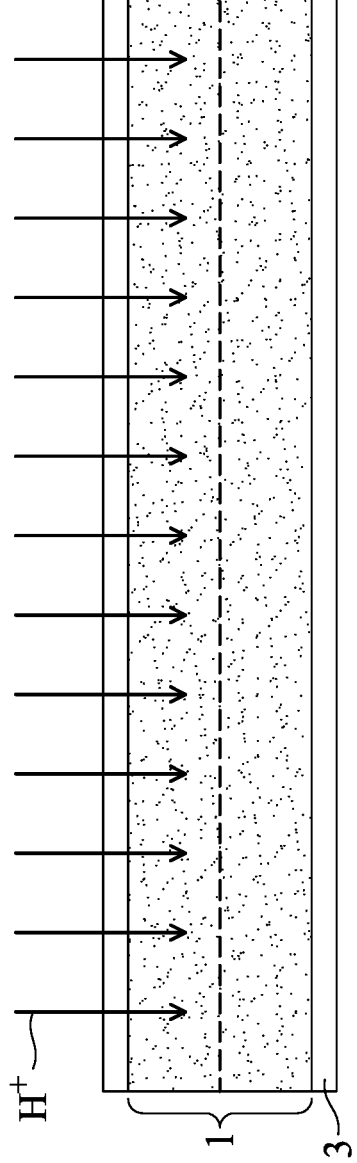
FIGS. 1A to 1N illustrate cross-sectional views of intermediate stages in the formation of a wafer-to-wafer bonding structure in accordance with some embodiments of the present disclosure.
Figure 1A:
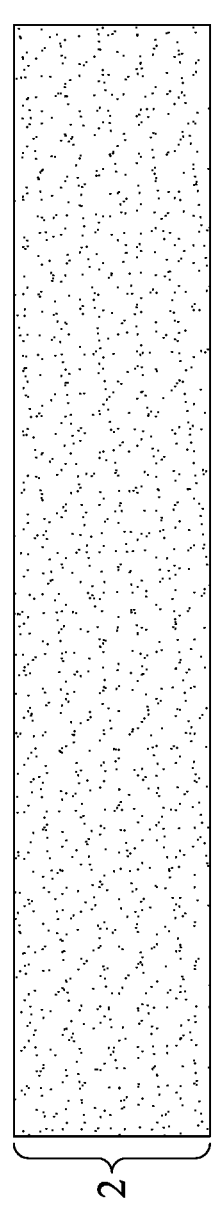

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to a method for forming a wafer-to-wafer bonding structure (or package). In accordance with some embodiments, a silicon-on-insulator (SOI) wafer (also referred to herein as a composite wafer) is first provided, which includes a substrate (e.g., a silicon wafer), an insulation layer (e.g., an oxide layer) on the substrate, and a first active layer (e.g., a silicon semiconductor layer) on the insulation layer. The substrate is further subjected to an ion implantation process to form an etch stop layer in the substrate. Through a removal process, a portion of the substrate material and the etch stop layer are removed, and the remainder of the substrate forms a second active layer. Also, integrated circuit (IC) devices and interconnection structures (and/or even conductive connectors for external connection) can then be formed on the first and second active layers on opposite sides of the insulation layer, and a conductive via structure can be formed through the first and second active layers and through the insulation layer to electrically connect the first and second devices, thereby forming a semiconductor IC structure with desired functionality. Note that the first active layer and second active layer are part of a first wafer and a second wafer, respectively, and they are bonded together by oxide bonding without the use of metal-to-metal bonding or hybrid bonding that requires higher pressure and higher temperature. Furthermore, since the thickness of both the first wafer and second wafer have been reduced (i.e., the first active layer is thinner than the unprocessed first wafer, and the second active layer is thinner than the unprocessed second wafer), an optical alignment process for aligning the active region of the first active layer (for disposing the first device) with the active region of the second active layer (for disposing the second device) can be easily and successfully performed from the bottom surface of the second active layer. Accordingly, it provides better overlay control. As a result, process yield is improved, and product performance and reliability are also improved.

Embodiments will be described with respect to a specific context, namely a wafer-to-wafer bonding (or wafer-on-wafer stacking) method and the resulting structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order FIGS. 1A to 1N illustrate cross-sectional views of intermediate stages in the formation of a wafer-to-wafer bonding structure/package in accordance with some embodiments of the present disclosure. Some corresponding processes are also reflected schematically in the process flow shown in FIGS. 3A and 3B.

Figure 1B:
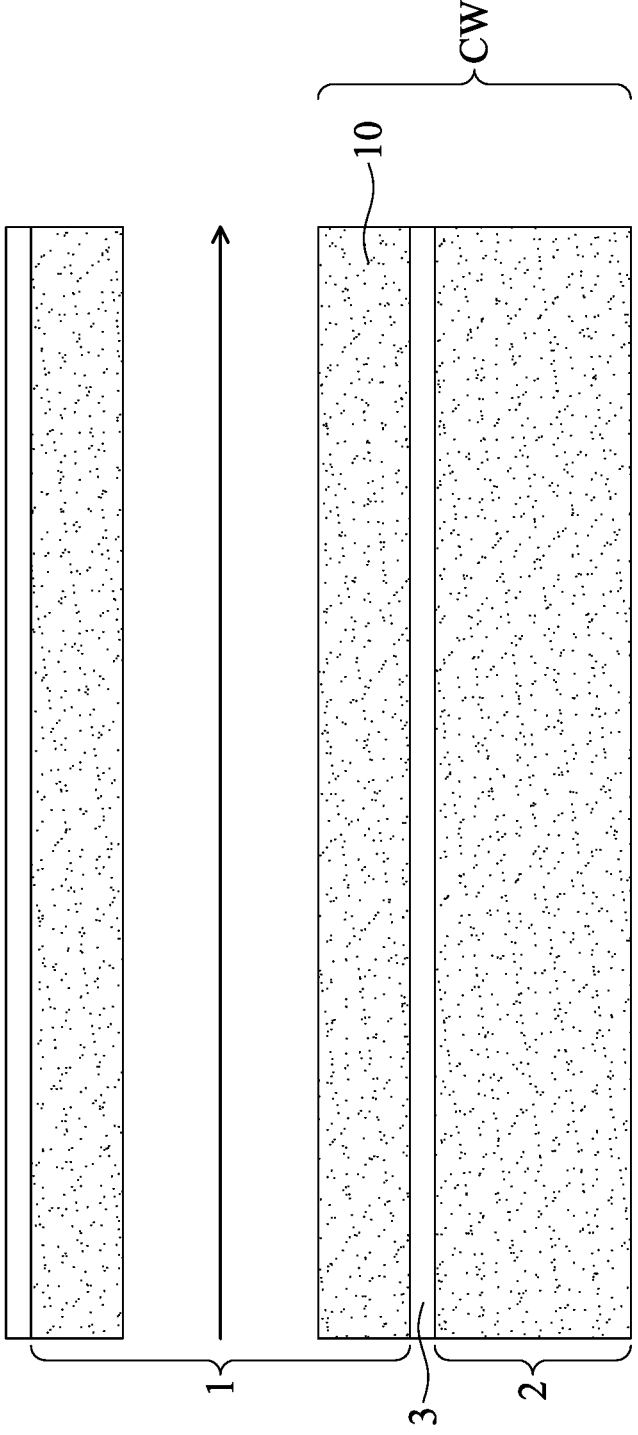
FIG. 1E-1 illustrates a cross-sectional view showing the further use of a de-bonding layer in an intermediate stage of forming a wafer-to-wafer bonding structure in accordance with some alternative embodiments of the present disclosure.

FIGS. 1A to 1B illustrate the formation of a composite wafer CW (see FIG. 1B). The respective process is illustrated as process 301 in the process flow 300 as shown in FIG. 3A. Referring first to FIG. 1A, a first wafer 1 and a second wafer 2 are provided. Each of the first wafer 1 and the second wafer 2 is preferably a bulk silicon wafer, although they may alternatively comprise other suitable semiconductor materials. A dielectric (or insulation) layer 3 is formed around the first wafer 1 to help bond the first wafer 1 to the second wafer 2 by fusion or oxide bonding (which will be described later with reference to FIG. 1B). Note that only a portion of the first wafer 1 and the second wafer 2 are shown in the figures, so the dielectric layer 3 is illustrated to cover only the upper and lower surfaces of the first wafer 1. In the present embodiments, the dielectric layer 3 is an oxide layer, which may comprise silicon oxide, and may be formed by thermal oxidation at a temperature between about 600° C. and about 1100° C. and at a pressure between about 1 torr and about 10 torr in an oxidizing ambient. Other dielectric or oxide materials compatible with fusion bonding may also be used, and other suitable processes (e.g., chemical vapor deposition (CVD)) may also be used to form the dielectric layer 3. The thickness of the dielectric layer 3 is preferably between about 10 nm and about 2000 nm.

Still referring to FIG. 1A, the first wafer 1 is also subjected to implantation of hydrogen ions H$^+$. The implanted hydrogen ions H$^+$ are used to form embrittlement (e.g., as shown by the dashed line in FIG. 1A) of the first wafer 1 below the dielectric layer 3, which causes the first wafer 1 to be separated or split during the subsequent annealing process (as illustrated in FIG. 1B). This implantation (and annealing) process is commonly referred to as the "hydrogen implantation and separation approach" in silicon-on-insulator (SOI) technology, and the details will not be repeated here.

Referring next to FIG. 1B, the implanted wafer (i.e., the first wafer 1) are bonded with another wafer (i.e., the second wafer 2) with the dielectric layer 3. In cases where the dielectric layer 3 is an oxide layer, fusion or oxide bonding is used. This oxide bonding can be performed with only slight pressure to initiate a bonding process by physically contacting the two surfaces of the wafers 1 and 2, and at room temperature. An anneal can then be used to strengthen the bonds, which may be very weak bonds initially. Furthermore, to facilitate the oxide bonding process, in an embodiment the dielectric layer 3 should be pre-polished to be very smooth with a surface roughness less than 10 Angstroms (Å), and in another embodiment, less than 10 Angstroms and sometimes less than 5 Angstroms. Other details of the fusion or oxide bonding are well known in the art and will not be repeated here.

Still referring to FIG. 1B, the bonded wafer are then split or cut (e.g., as shown by the arrow in FIG. 1B) across the first wafer 1 at the peak location of the implanted hydrogen ions by appropriate annealing (not shown). That is, the thickness of the first wafer 1 is reduced by removing a portion (e.g., the upper separation portion shown in FIG. 1B) of the material of the first wafer 1. In FIG. 1B, the resulting structure includes the second wafer 2, the dielectric layer 3 on the second wafer 2, and the portion 10 of the first wafer 1 remains on the dielectric layer 3, which constitute a composite wafer CW. Note that the composite wafer CW including a substrate (e.g., the second wafer 2), an insulation layer (e.g., the dielectric layer 3) on the substrate, and a (semiconductor) active layer (e.g., the remaining portion 10 of the first wafer 1) on the insulation layer has the same or similar configuration as a typical SOI wafer, so the second wafer 2 may also be called the substrate 2, the dielectric layer 3 may also be called the insulation layer 3, and the remaining portion 10 of the first wafer 1 may also be called the active layer 10 in the following description.

Figure 1C:
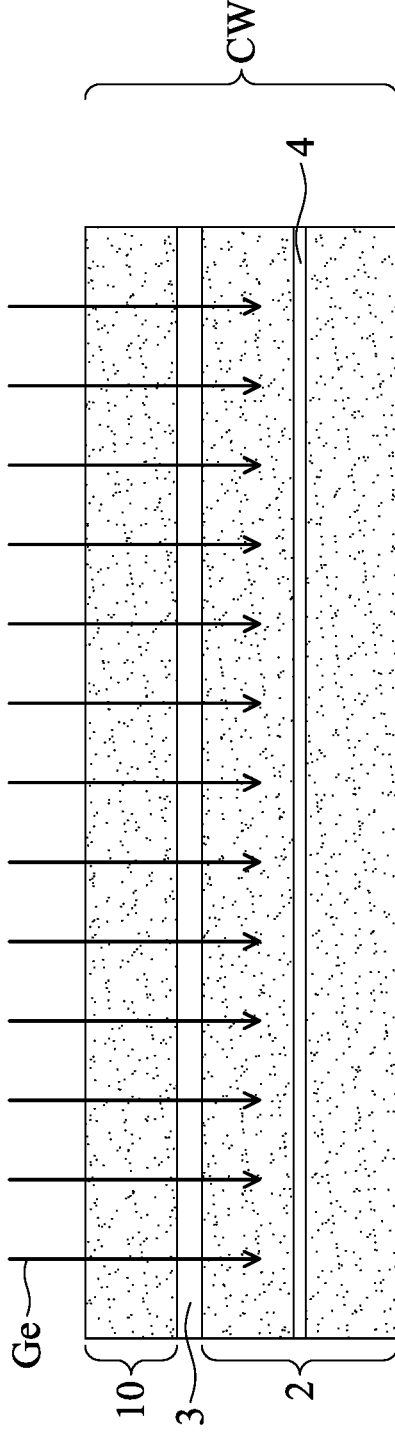
Figure 1D:
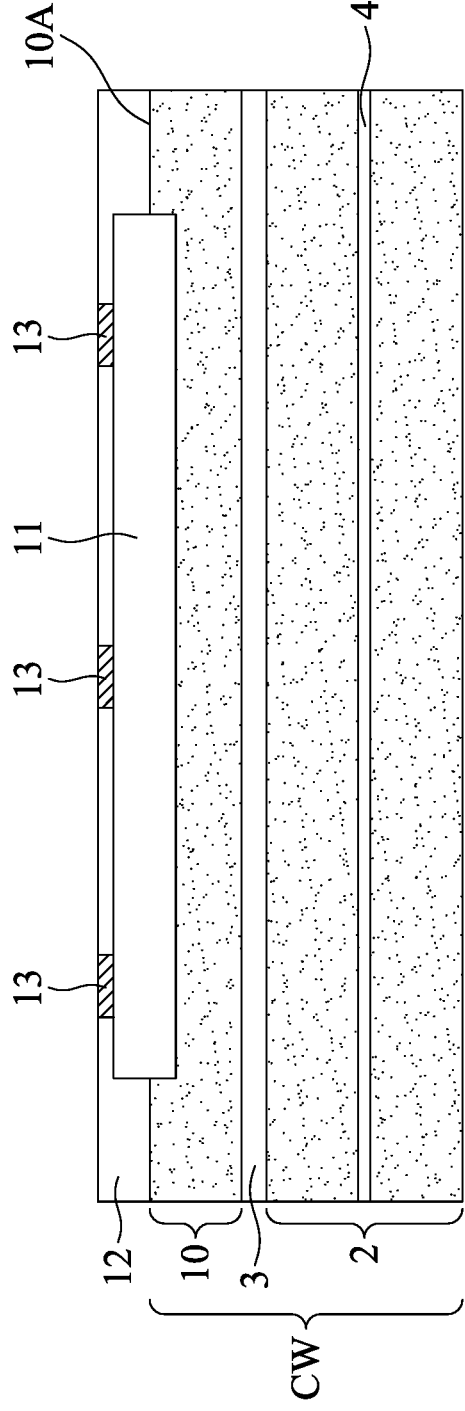
Figure 1E:
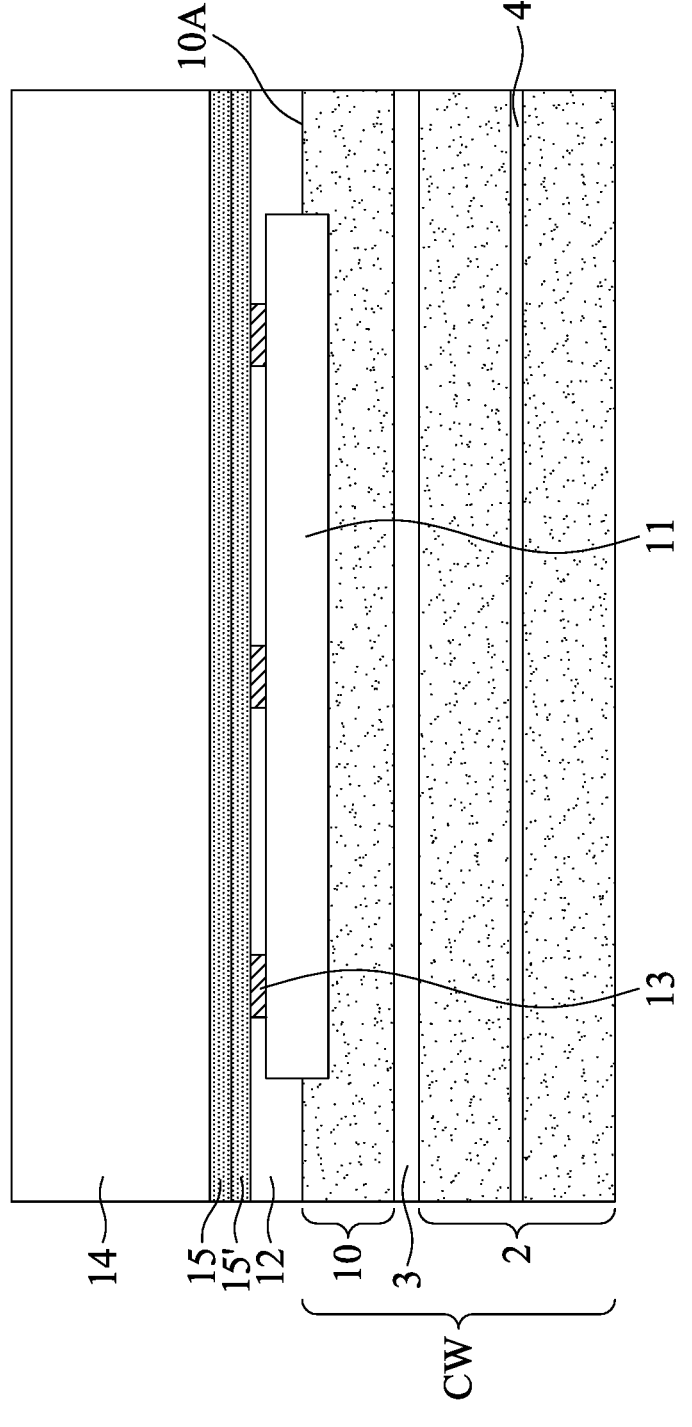
Figures 1, 1E:
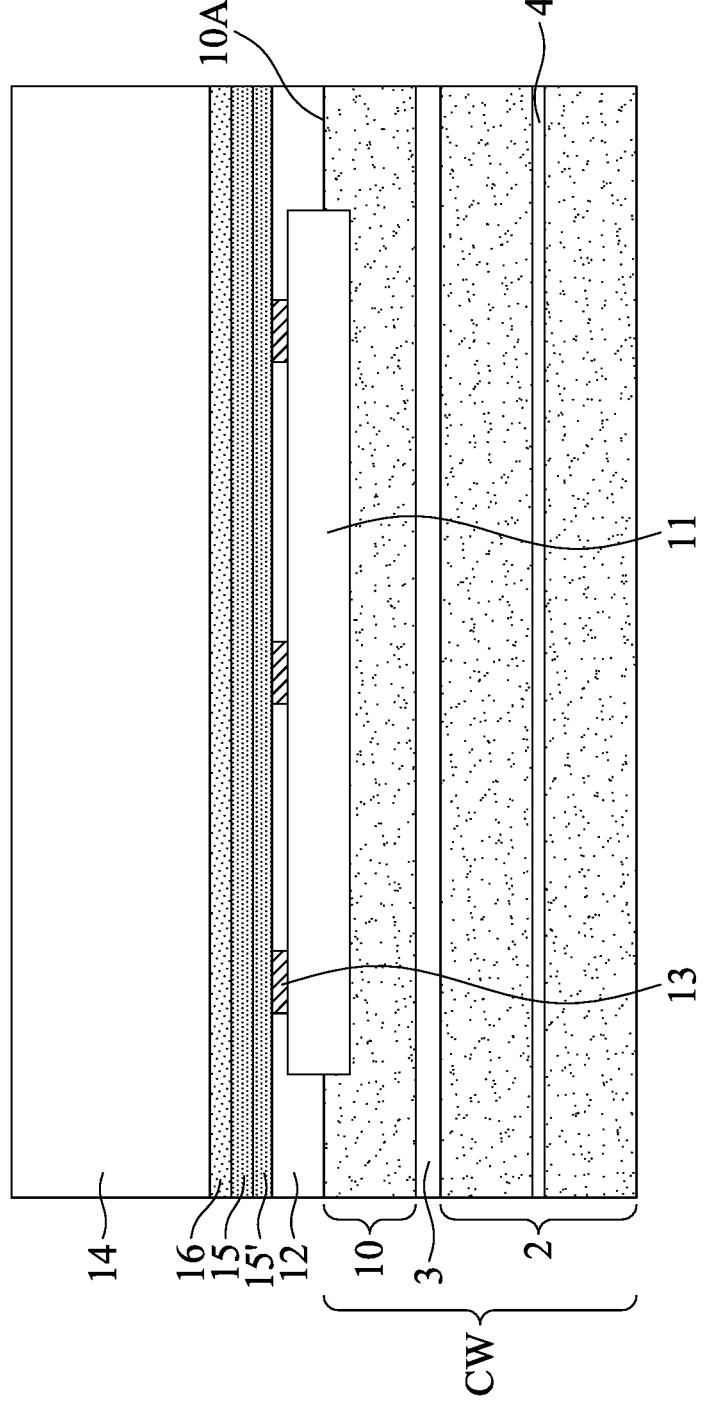
Figure 1F:
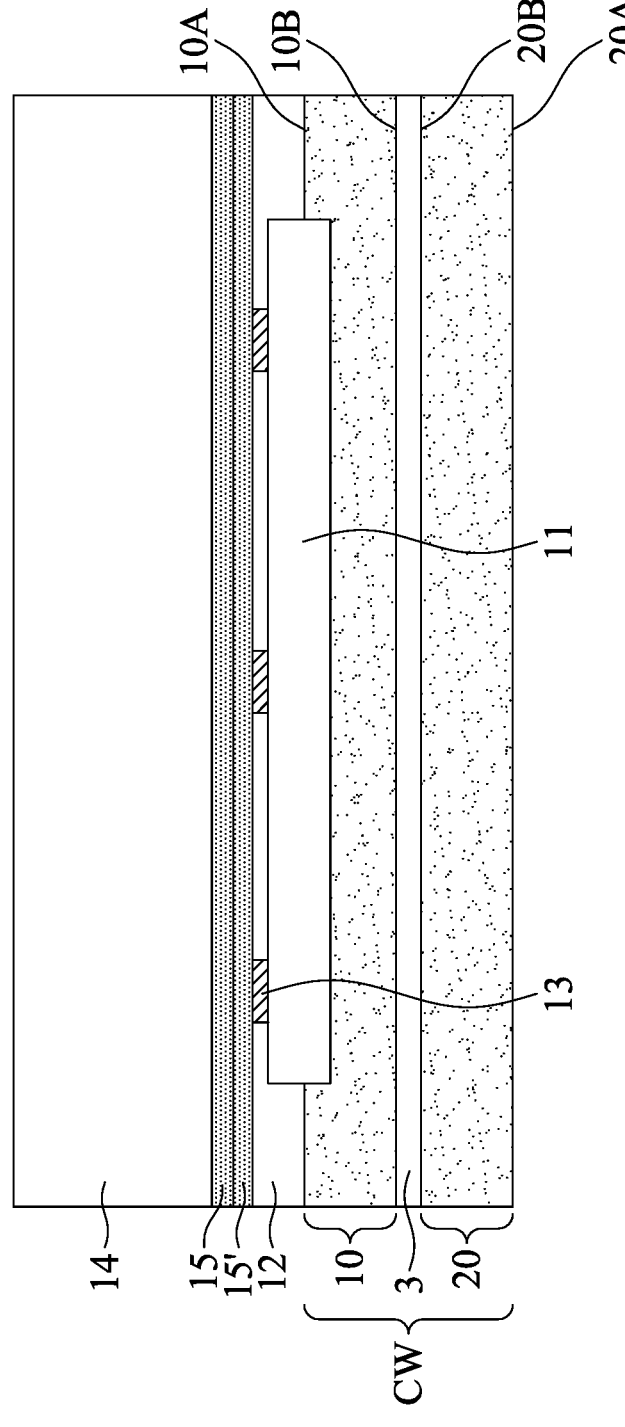

FIG. 1C illustrate the formation of an etch stop layer 4 in the substrate 2 of the composite wafer CW, where the etch stop layer 4 is used as an etch stop layer for the substrate 2 during the subsequent etching or removal process shown in FIG. 1F. The respective process is illustrated as process 302 in the process flow 300 as shown in FIG. 3A. The formation process of the etch stop layer 4 may include subjecting the composite wafer CW to ion implantation as shown in FIG. 1C and/or appropriate annealing (not shown). In the present embodiments, the implanted or doped ions are germanium ions Ge, and the formed etch stop layer 4 comprises silicon germanium (SiGe). Other suitable implanted ions may also be used to form an etch stop layer 4 with relatively large etch selectivity compared to silicon material of the substrate 2. Such a method of forming an etch stop layer 4 in the silicon substrate by ion implantation has been commonly used in the art, and therefore the details will not be repeated here.

It should be noted that although FIG. 1C illustrates that the etch stop layer 4 is formed in the substrate 2 (i.e., second wafer 2) after the first wafer 1 is bonded to the second wafer 2 as illustrated in FIG. 1B, it is also possible that the etch stop layer 4 is formed in the second wafer 2 before the first wafer 1 is bonded to the second wafer 2 (e.g., at the stage of FIG. 1A) in different embodiments.

FIG. 1D illustrates the formation of integrated circuit (IC) devices 11 on the top surface 10A (which may also be referred to an active surface 10A) of the active layer 10 of the composite wafer CW. The respective process is illustrated as process 303 in the process flow 300 as shown in FIG. 3A. Example of the integrated circuit devices 11 may include transistors (such as complementary metal-oxide semiconductor (CMOS) transistors, fin field-effect transistors (FinFETs), gate-all-around (GAA) field-effect transistors or the like), diodes, resistors, capacitors, inductors and/or the like. The structure and formation method of the integrated circuit devices 11 are well known in the art, and will not be repeated herein.

It should be appreciated that the active layer 10 may include a plurality of active regions (which may also be referred to die regions) therein, with only one active/die region being shown in FIG. 1D. One or more integrated circuit devices 11 may be disposed or formed in one active/ die region on the top surface 10A of the active layer 10, in various embodiments. Also, peripheral trench regions (not shown) are arranged around each active/die region for setting alignment marks for defining the respective active/ die regions (which will be described further below).

In FIG. 1D, an inter-layer dielectric (ILD) layer 12 is formed over the integrated circuit devices 11 and over the active layer 10, and fills the space between the gate stacks of transistors (not shown) in the integrated circuit devices 11. In accordance with some embodiments, the inter-layer dielectric layer 12 is formed of phosphor-silicate glass (PSG), boro-silicate glass (BSG), boron-doped phosphor-silicate glass (BPSG), fluorine-doped silicate glass (FSG), silicon oxide, or the like. The inter-layer dielectric layer 12 may be formed using spin coating, flowable chemical vapor deposition (FCVD), chemical vapor deposition (CVD), plasma enhanced chemical vapor deposition (PECVD), low pressure chemical vapor deposition (LPCVD), or the like.

Also, contact plugs 13 are formed in the inter-layer dielectric layer 12, and are used to electrically connect integrated circuit devices 11 to overlying conductive features. In accordance with some embodiments, contact plugs 13 are formed of a conductive material selected from tungsten, aluminum, copper, titanium, tantalum, ruthenium, molybdenum, titanium nitride, tantalum nitride, alloys therefore, and/or multi-layers thereof. The formation process of the contact plugs 13 may include forming contact openings in the inter-layer dielectric layer 12, filling a conductive material(s) into the contact openings, and performing a planarization (such as chemical mechanical polish (CMP) process) to level the top surfaces of contact plugs 13 with the top surface of inter-layer dielectric layer 12.

FIG. 1E illustrates the attachment or bonding of a (first) carrier 14 to the resulting structure of FIG. 1D. The respective process is illustrated as process 304 in the process flow 300 as shown in FIG. 3A. The carrier 14 is used to provide temporary mechanical and structural support for the processing of build-up layers or structures during subsequent processing steps. The carrier 14 may be a glass carrier, a silicon wafer, an organic carrier, or the like, and may have a thickness of about 700 nm to about 800 nm. The attachment of the carrier 14 may include forming an oxide layer 15 below the carrier 14, forming another oxide layer 15' over the inter-layer dielectric layer 12, bring the oxide layer 15 into contact with the oxide layer 15', and bonding the carrier 14 to the inter-layer dielectric layer 12 (and underlying integrated circuit device 11) with the oxide layers 15 and 15' by oxide-to-oxide bonding. Example of the oxide layers 15 and 15' may include high quality oxides such as high density plasma (HDP) oxides, thermal oxides, tetraethoxysilane (TEOS) oxides to enhance the oxide-to-oxide bonding. This oxide-to-oxide bonding can be performed with only slight pressure to initiate a bonding process by physically contacting the two surfaces of the oxide layers 15 and 15', and at room temperature. An anneal can then be used to strengthen the bonds, which may be very weak bonds initially. To facilitate the oxide-to-oxide bonding process, the oxide layers 15 and 15' may also be pre-polished to have a relatively small surface roughness like the dielectric layer 3 illustrated in FIG. 1B. The total thickness of the oxide layers 15 and 15' may be in a range between 50 nm and 2000 nm. Other details of the oxide-to-oxide bonding are well known in the art and will not be repeated here.

FIG. 1E-1 illustrates the use of an additional de-bonding layer 16 in accordance with some alternative embodiments. The de-bonding layer 16 may include a light-to-heat conversion (LTHC) layer or an adhesive layer (such as a ultra-violet curable adhesive or a heat curable adhesive layer). The de-bonding layer 16 is decomposable under the heat of light (such as laser), so as to facilitate removal of the carrier 14 from the connecting structure in a subsequent step (which will be further described later with reference to FIG. 1J).

FIG. 1F illustrates the thinning of the substrate 2 (see FIG. 1E) and the formation of another active layer 20 under the dielectric layer 3. The respective process is illustrated as process 305 in the process flow 300 as shown in FIG. 3A. The thinning of the substrate 2 (i.e., the second wafer 2) may include removing a portion of the material of the substrate 2 under the etch stop layer 4 (see FIG. 1E), and removing the etch stop layer 4, to leave a portion of the substrate 2 that was originally between the dielectric layer 3 and the etch stop layer 4. That is, the thickness of the second wafer 2 is reduced by removing a portion of the material of the second wafer 2 under the etch stop layer 4 and by removing the etch stop layer 4. As shown in FIG. 1F, after thinning the substrate 2, the remaining portion of the substrate 2 forms another active layer 20 under the dielectric layer 3, where the active layers 10 and 20 are located on both sides of the dielectric layer 3. More specifically, the active layer 10 has a back surface 10B (opposite to the active surface 10A) and the active layer 20 has a back surface 20B, where the back surfaces 10B and 20B face to each other, and the dielectric layer 3 is located between and in contact with the back surfaces 10B and 20B to isolate the active layers 10 and 20. The active layer 20 also has a bottom surface 20A (which may also be referred to an active surface 20A) opposite to the back surface 20B, and the bottom surface 20A of the active layer 20 is exposed after thinning the substrate 2.

In accordance with some embodiments, the removal process of the material portion of the substrate 2 includes trimming, grinding, chemical mechanical polish (CMP) process, dry etching, wet etching, other suitable removal processes, and/or a combination thereof. In accordance with some embodiments, the removal process of the etch stop layer 4 (e.g., SiGe material) includes wet etching using etchants such as $NH_4OH$, SC1, Tetramethylammonium Hydroxide (TMAH). Other etchants and/or other removal process may also be used to remove the etch stop layer 4.

Figure 1G:
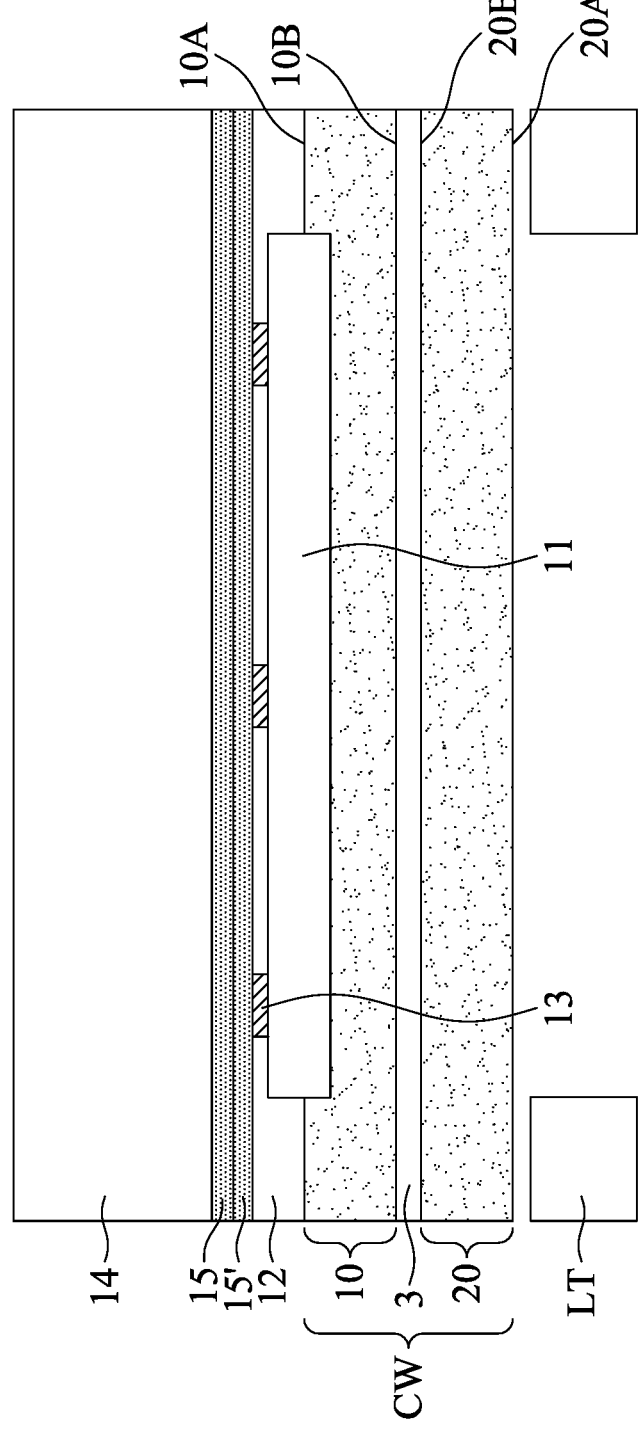

FIG. 1G illustrates that an alignment process is performed on the exposed bottom surface 20A of the active layer 20, which is used to align the (first) active region(s) of the active layer 10 above the dielectric layer 3 with the (second) active region(s) of the active layer 20 below the dielectric layer 3. The respective process is illustrated as process 306 in the process flow 300 as shown in FIG. 3A. The alignment process may include obtaining or determining the position of the first active region (for disposing the integrated circuit device 11) on the top surface 10A of the active layer 10 in an optical manner from the bottom surface 20A of the second active layer 20 (for example, emitting a light passing through the active layer 20, dielectric layer 3 and active layer 10 to reach the top surface 10A of active layer 10, where the integrated devices 11 and alignment marks are formed the top surface 10A, and then receiving the reflected light from the top surface 10A), and then determining the position of the second active region (for disposing the integrated circuit device 21, which will be described later with reference to FIG. 1H) on the bottom surface 20A of the active layer 20 in similar optical manner, so that the second active region is aligned with the first active region. In accordance with some embodiments, to align two active regions, it can be achieved by aligning the alignment marks in the corresponding two peripheral trench regions associated with those two active regions. However, other alignment methods may also be used. Other details of the optical alignment process are well known in the art and will not be repeated here. The above optical alignment process can be performed with a lithography tool LT such as an extreme ultra-violet (EUV) scanner, as shown in FIG. 1G. Other tools that can perform the above optical alignment process may also be used.

As mentioned above, since the thickness of both the first wafer 1 and second wafer 2 have been reduced (i.e., the (first) active layer 10 is thinner than the unprocessed first wafer 1, and the (second) active layer 20 is thinner than the unprocessed second wafer 2), an optical alignment process for aligning the active region of the first active layer 10 with the active region of the second active layer 20 can be easily and successfully performed from the bottom surface 20A of the second active layer 20 due to the reduced distance that the light has to travel in the wafers. Accordingly, it provides better overlay control (e.g., OVL control can be less than about 10 nm) than existing wafer-on-wafer stacking techniques (their OVL control is typically only less than about 100 nm). As a result, process yield is improved, and product performance and reliability are also improved.

Figure 1H:
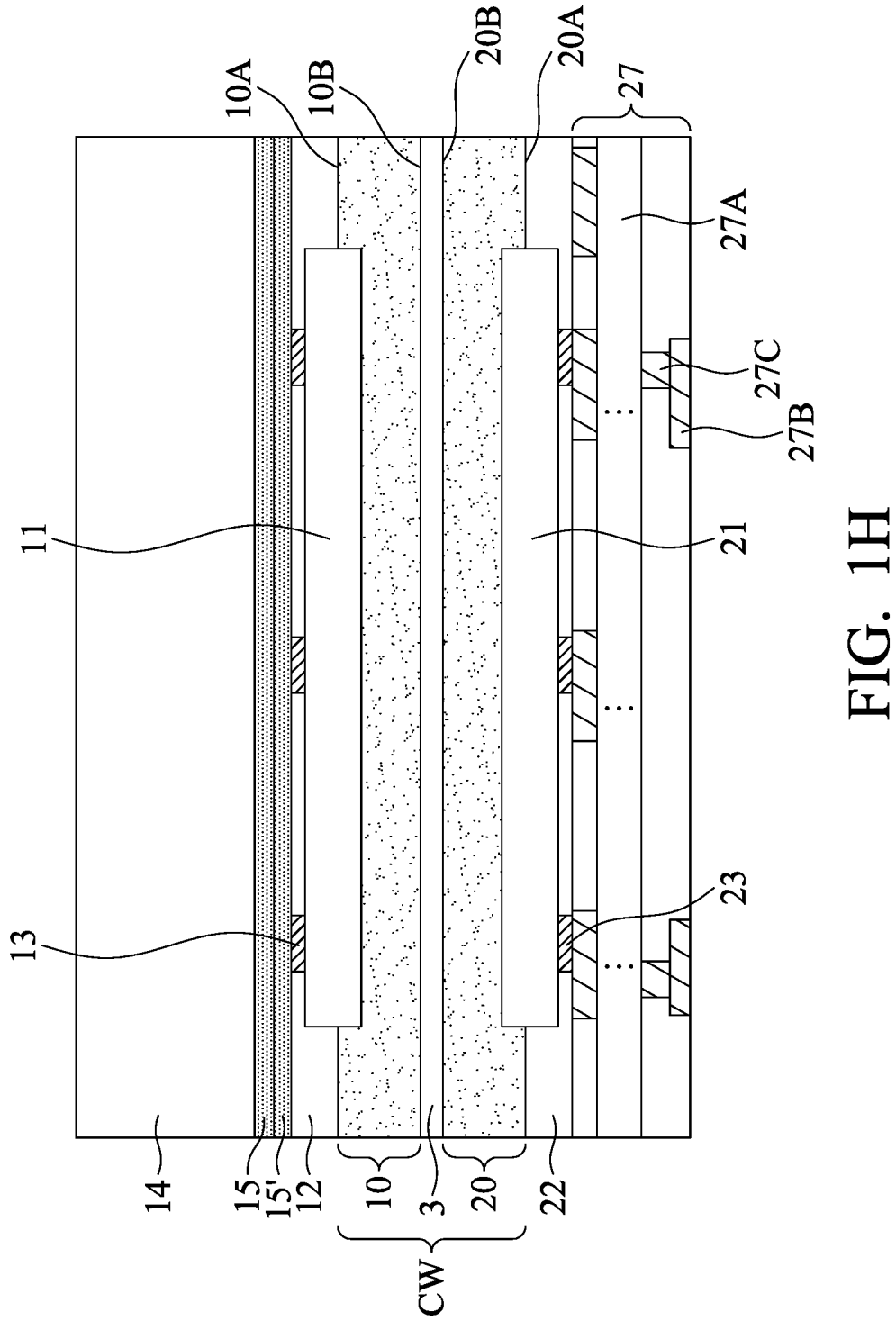

FIG. 1H illustrates the formation of integrated circuit (IC) devices 21 on the bottom (or active) surface 20A of the active layer 20 of the composite wafer CW. The respective process is illustrated as process 307 in the process flow 300 as shown in FIG. 3A. Similar to the integrated circuit devices 11 discussed above, example of the integrated circuit devices 21 may include transistors (such as complementary metal-oxide semiconductor (CMOS) transistors, fin field-effect transistors (FinFETs), gate-all-around (GAA) field-effect transistors or the like), diodes, resistors, capacitors, inductors and/or the like. The structure and formation method of the integrated circuit devices 21 are well known in the art, and will not be repeated herein.

Moreover, the active layer 20 may include a plurality of active regions (which may also be referred to die regions) therein, with only one active/die region being shown in FIG. 1H. One or more integrated circuit devices 21 may be disposed or formed in one active/die region on the bottom surface 20A of the active layer 20, in various embodiments. Also, peripheral trench regions (not shown) are arranged around each active/die region for setting alignment marks for defining the respective active/die regions.

In various embodiments, the integrated circuit devices 21 may be the same as or different from the integrated circuit devices 11. As an example, the integrated circuit devices 21 are GAA field-effect transistors, and the integrated circuit devices 11 are FinFETs. Any other combination of the integrated circuit devices 11 and 21 may also be used. In some cases, one of the first wafer 1 and the second wafer 2 may be an interposer wafer and no integrated circuit devices are formed in that interposer wafer.

In FIG. 1H, an inter-layer dielectric (ILD) layer 22 is formed below the integrated circuit devices 21 and below the active layer 20, and fills the space between the gate stacks of transistors (not shown) in the integrated circuit devices 21. The material and formation method of the inter-layer dielectric layer 22 may be the same as or similar to those of the inter-layer dielectric layer 12 illustrated in FIG. 1D. Also, contact plugs 23 are formed in the inter-layer dielectric layer 22, and are used to electrically connect integrated circuit devices 21 to underlying conductive features. The material and formation method of the contact plugs 23 may be the same as or similar to those of the contact plugs 13 illustrated in FIG. 1D.

Still referring to FIG. 1H, which also illustrates the formation of an interconnect structure 27 (which may also be referred to as a second interconnect structure 27) below the inter-layer dielectric layer 22 and the contact plugs 23 and coupled to (i.e., electrically connected to) the integrated circuit devices 21 through the contact plugs 23. The respective process is also illustrated as process 307 in the process flow 300 as shown in FIG. 3A. The interconnect structure 27 includes dielectric layers 27A. The dielectric layers 27A are alternatively referred to as Inter-Metal Dielectric (IMD) layers 27A hereinafter. Some of all of the dielectric layers 27A may be formed of low-k dielectric materials such as Black Diamond (a registered trademark of Applied Materials), a carbon-containing low-k dielectric material, hydrogen SilsesQuioxane (HSQ), MethylSilsesQuioxane (MSQ), or the like. Alternatively, some or all of dielectric layers 27A may be formed of non-low-k dielectric materials such as silicon oxide, silicon carbide (SiC), silicon carbo-nitride (SiCN), silicon oxy-carbo-nitride (SiOCN), or the like. The dielectric layers 27A may be formed by any suitable deposition process.

The interconnect structure 27 also includes metal lines 27B and vias 27C formed in the dielectric layers 27A. The metal lines 27B at the same level are collectively referred to as a metal layer hereinafter. In accordance with some embodiments, the interconnect structure 27 includes a plurality of metal layers that are interconnected through the vias 27C. The metal lines 27B and the vias 27C may be formed of copper, aluminum, silver, or the alloys thereof, and they can also be formed of other metals. The formation process may include single damascene and dual damascene processes, which are well known in the art and not repeated here.

Figure 1I:
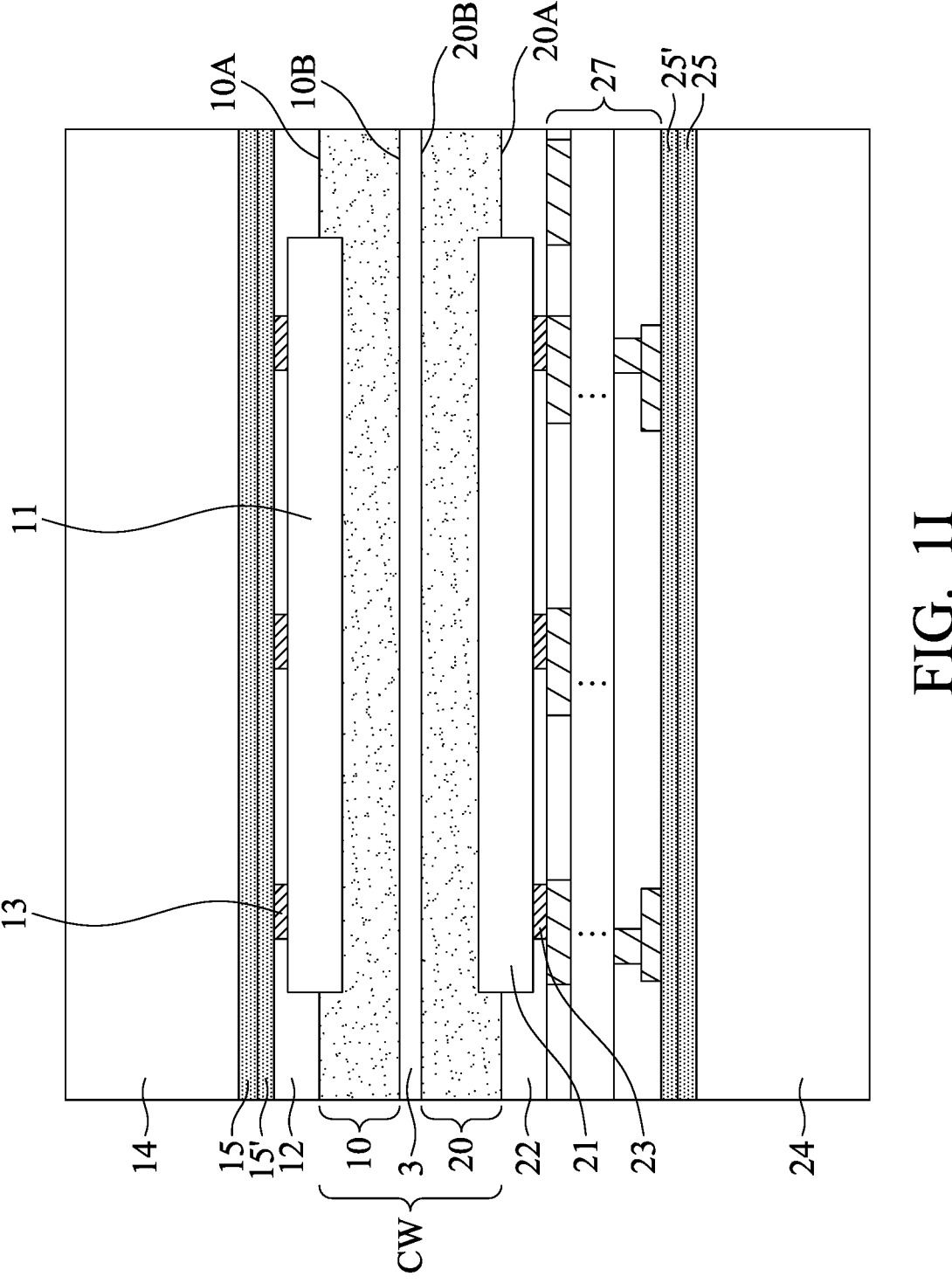

FIG. 1I illustrates the attachment or bonding of a (second) carrier 24 to the resulting structure of FIG. 1H. The respective process is illustrated as process 308 in the process flow 300 as shown in FIG. 3A. Similar to the carrier 14 discussed above, the carrier 24 is used to provide temporary mechanical and structural support for the processing of build-up layers or structures during subsequent processing steps. The carrier 24 may be a glass carrier, a silicon wafer, an organic carrier, or the like, and may have a thickness of about 700 nm to about 800 nm. The attachment of the carrier 24 may include forming an oxide layer 25 over the carrier 24, forming another oxide layer 25' below the interconnect structure 27, bring the oxide layer 25 into contact with the oxide layer 25', and bonding the carrier 24 to the interconnect structure 27 (and overlying device 21) with the oxide layers 25 and 25' by oxide-to-oxide bonding. The material and bonding method of the oxide layers 25 and 25' may be the same as or similar to those of the oxide layer 15 and 15' illustrated in FIG. 1E, and will not repeated here. In some alternative embodiments, a de-bonding layer (not shown), which is similar to the de-bonding layer 16 illustrated in FIG. 1E-1, is formed over the carrier 24 prior to forming the oxide layers 25 and 25', so as to facilitate removal of the carrier 24 from the connecting structure in a subsequent step.

Figure 1J:
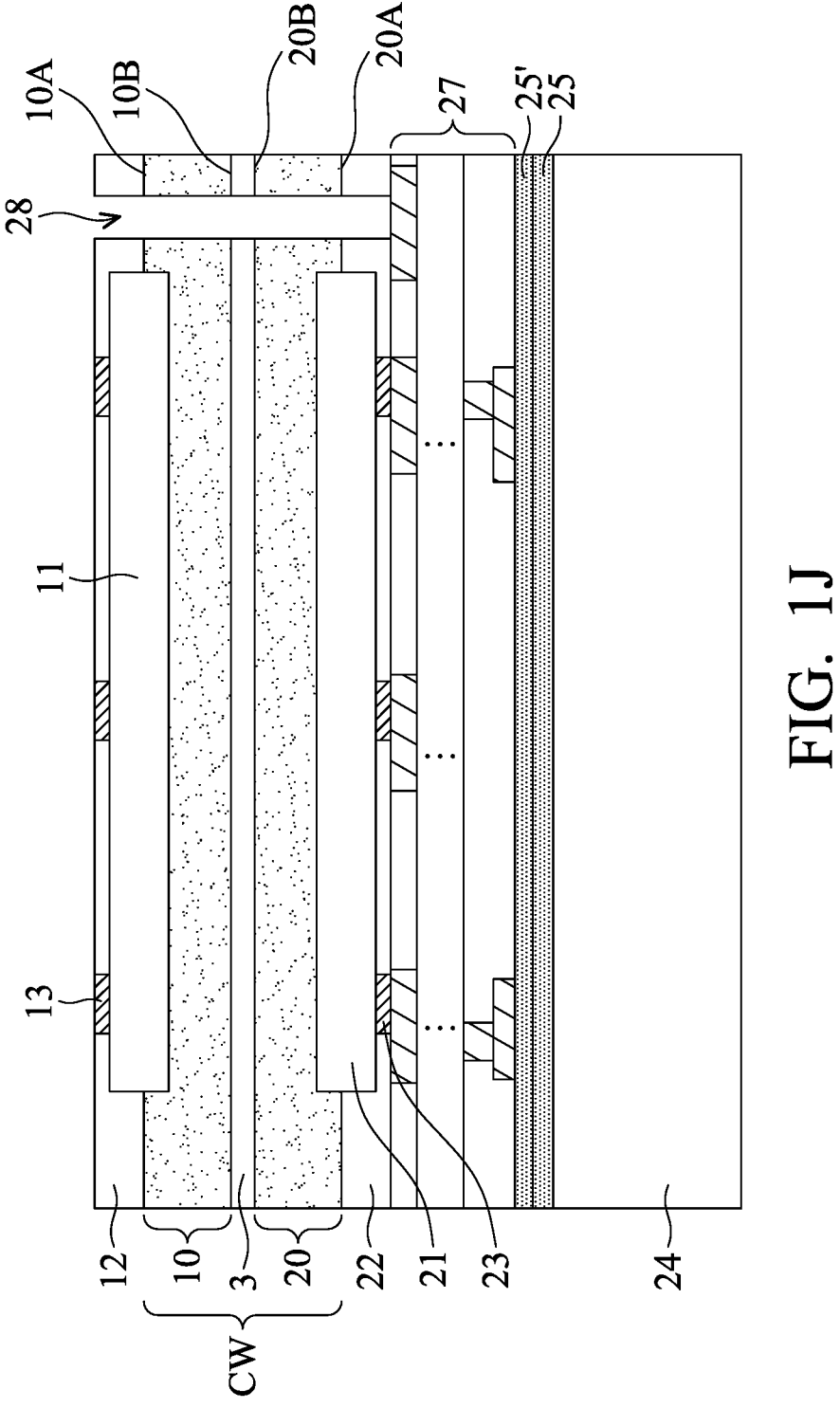

FIG. 1J illustrates the removal of the carrier 14 (see FIG. 1I). The respective process is illustrated as process 309 in the process flow 300 as shown in FIG. 3A. In some cases where no de-bonding layer 16 is used (e.g., see FIG. 1E), the carrier 14 may be removed such as by grinding, polishing, and/or an anisotropic or isotropic etching process. In some cases where a de-bonding layer 16 is used (e.g., see FIG. 1E-1), the carrier 14 may be removed by projecting light, such as a laser light or an UV light, on the de-bonding layer 16 (e.g., the LTHC layer) to decompose the de-bonding layer 16 under the heat of light, such that the carrier 14 can be easily removed. After the carrier 14 have been removed, the exposed de-bonding layer 16 and the oxide-to-oxide structure (e.g., oxide layers 15 and 15' shown in FIG. 1I) may be removed or peeled by dry etching, wet etching, CMP process, other suitable removal processes, and/or a combination thereof.

Still referring to FIG. 1J, which also illustrates the formation of a via cavity 28 through (first) active layer 10, through the insulation/dielectric layer 3, through the (second) active layer 20, through the inter-layer dielectric layers 12 and 22, and to one conductive feature (e.g., one conductive contact pad in the topmost dielectric layer 27A) of the interconnection structure 27. The respective process is also illustrated as process 309 in the process flow 300 as shown in FIG. 3A. The formation process of the via cavity 28 may include applying a photoresist later (not shown) over the exposed top surface of the inter-layer dielectric layer 12, lithographically patterning the photoresist layer to form an opening in the area in which the via cavity 28 is to be subsequently formed, and performing an anisotropic etching process to transfer the pattern of the opening in the photoresist layer through the (first) active layer 10, through the insulation/dielectric layer 3, through the (second) active layer 20, through the inter-layer dielectric layers 12 and 22, and to the top surface of one conductive feature of the interconnection structure 27 that underlie the opening in the photoresist layer. The cavity formed by the anisotropic etching process constitute the via cavity 28. The photoresist layer may be subsequently removed, for example, by ashing.

Figure 1K:
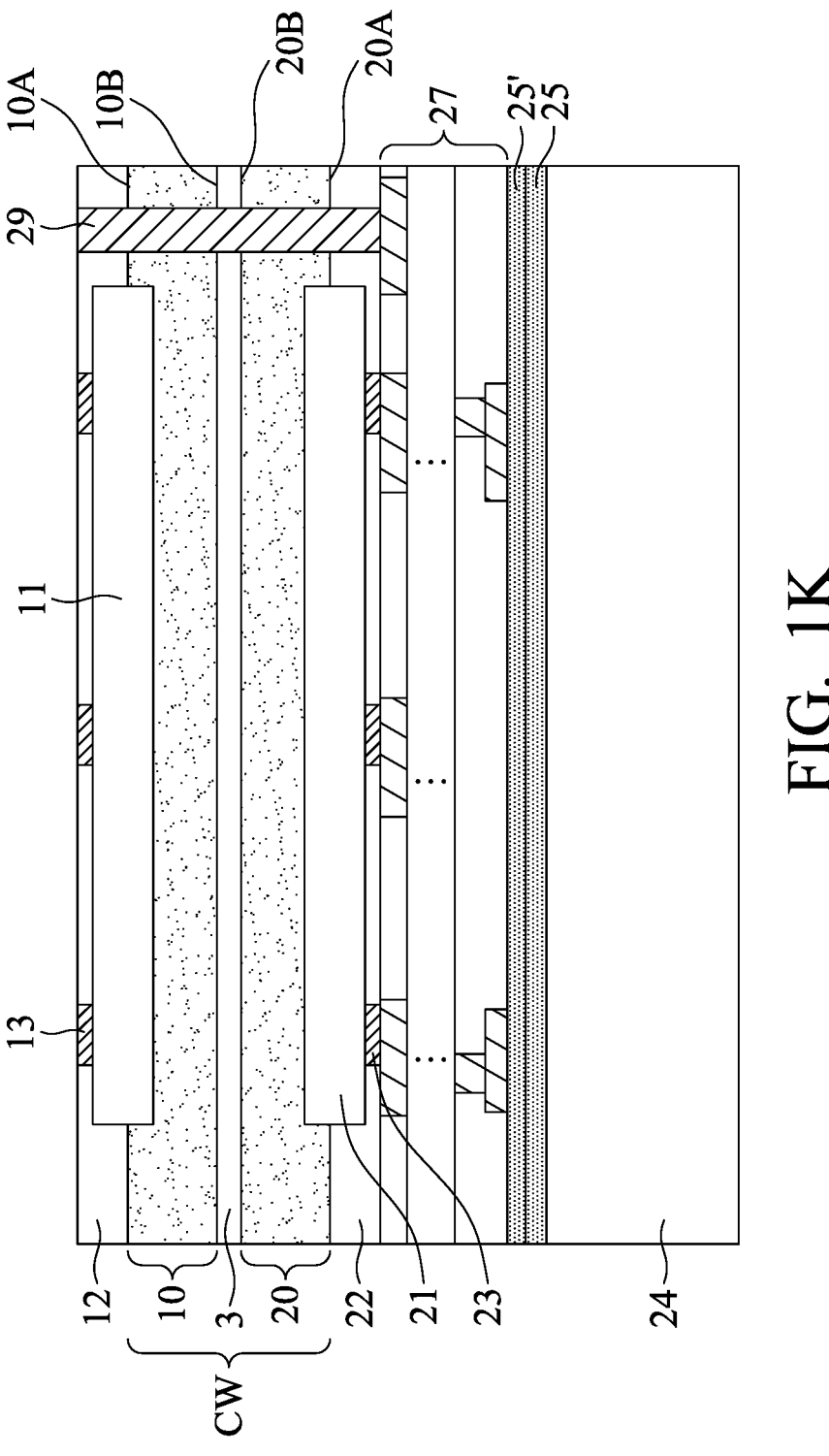
Figure 3B:
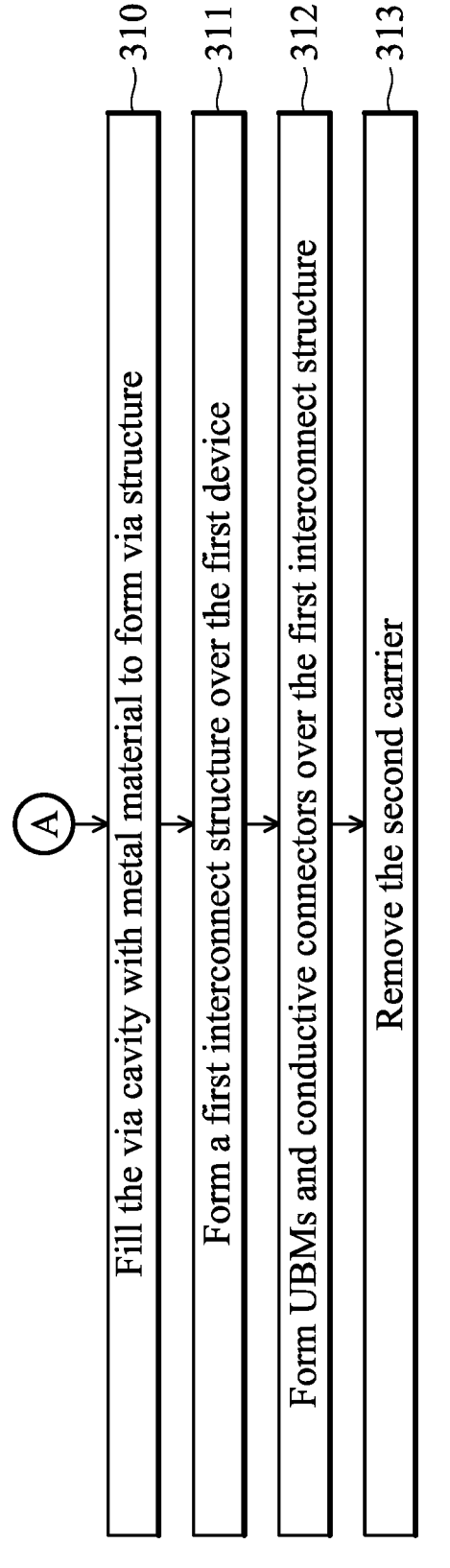

FIG. 1K illustrates the filling of conductive (e.g., metal) material in the via cavity 28 (see FIG. 1J) to form a via structure 29. The respective process is illustrated as process 310 in the process flow 300 as shown in FIG. 3B. The formation process of the via structure 29 may include forming a diffusion barrier (not shown) over the top surfaces of inter-layer dielectric layer 12 and contact plugs 13, and on the bottom and sidewalls of the via cavity 28; depositing a metal material (not shown) over the diffusion barrier and filled in the remaining portion of the via cavity 28; and performing a planarization process (not shown) such as CMP process to remove excess portions of the metal material, until the top surfaces of inter-layer dielectric layer 12 and contact plugs 13 are exposed. The remaining portions of the diffusion barrier and the metal material in the via cavity 28 constitute the via structure 29. The via structure 29 vertically extends through the (first) active layer 10, the insulation/dielectric layer 3, the (second) active layer 20 and the inter-layer dielectric layers 12 and 22, and contacts the top surface of one conductive feature of the interconnection structure 27.

In accordance with some embodiments, the diffusion barrier is formed of titanium, titanium nitride, tantalum, tantalum nitride, or the like. The diffusion barrier may be formed, for example, using Atomic Layer Deposition (ALD), Physical Vapor Deposition (PVD), or the like. The thickness of the diffusion barrier is preferably between about 0.5 nm and about 5 nm. In accordance with some embodiments, the deposited metal material includes copper, tungsten, aluminum, cobalt, tantalum, tantalum, ruthenium, molybdenum, silver, alloys thereof, or other suitable metal materials. The width of the via structure 29 is preferably between about 20 nm and about 1000 nm, and/or the height of the via structure 29 is preferably between about 100 nm and about 10000 nm.

Figure 1L:
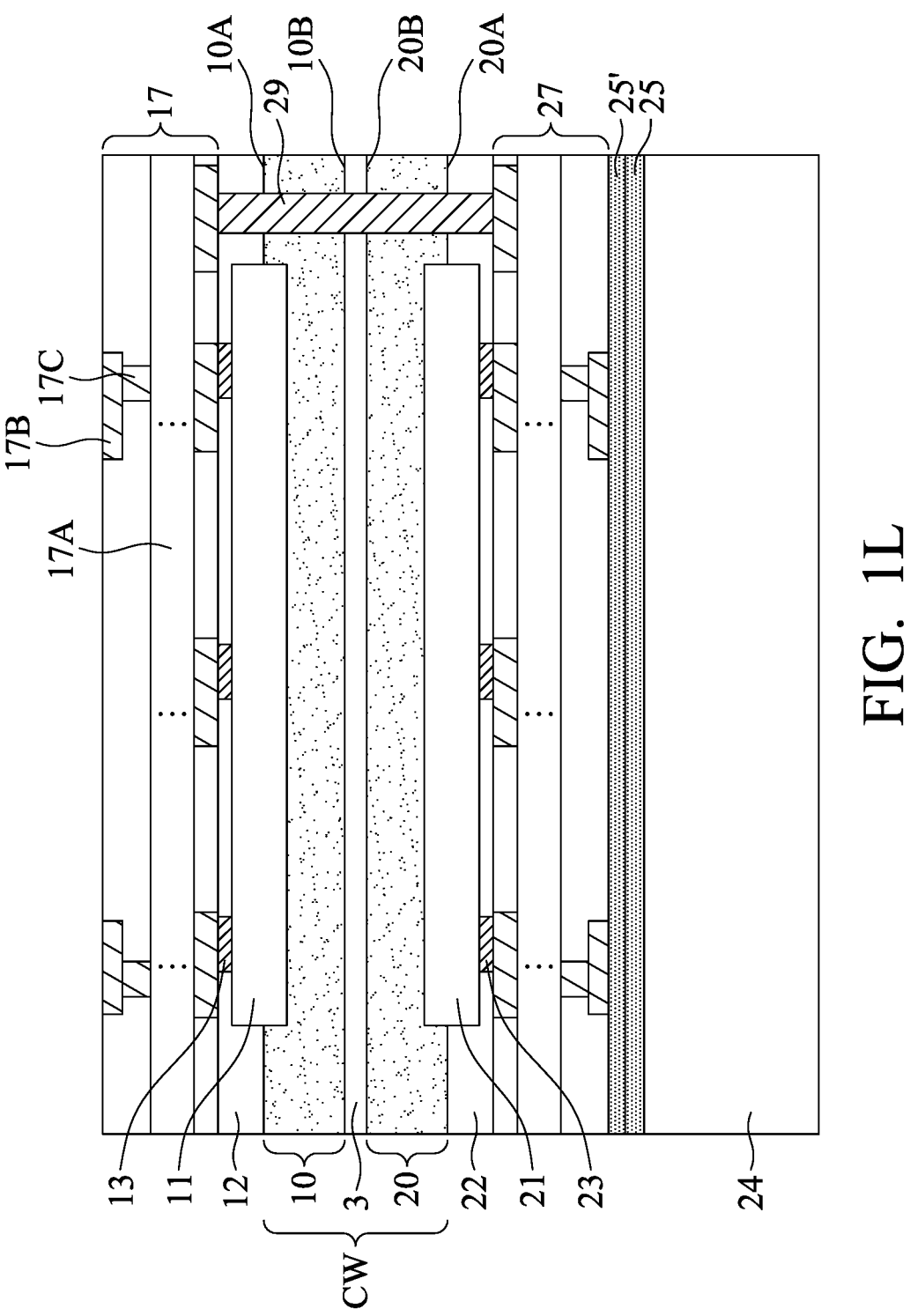

FIG. 1L illustrates the formation of an interconnect structure 17 (which may also be referred to as a first interconnect structure 17) over the inter-layer dielectric layer 12 and the contact plugs 13 and coupled to (i.e., electrically connected to) the integrated circuit devices 11 through the contact plugs 13. The respective process is illustrated as process 311 in the process flow 300 as shown in FIG. 3B. The interconnect structure 17 includes dielectric layers 17A, metal lines 17B and vias 17C, which may be the same as or similar to the dielectric layers 27A, metal lines 27B and vias 27C of the interconnect structure 27 illustrated in FIG. 1H. FIG. 1L also illustrates that the via structure 29 contact the bottom surface of one conductive feature ((e.g., one conductive contact pad 17B in the bottom-most dielectric layer 17A)) of the interconnect structure 17. Accordingly, the via structure 29 electrically connects the interconnect structures 17 and 27 and also electrically connects the integrated circuit devices 11 and 22. That is, the integrated circuit devices 11 and 22 on both sides of the dielectric layer 3 can communicate with each other through the via structure 29 and the interconnect structures 17 and 27.

Figure 1M:
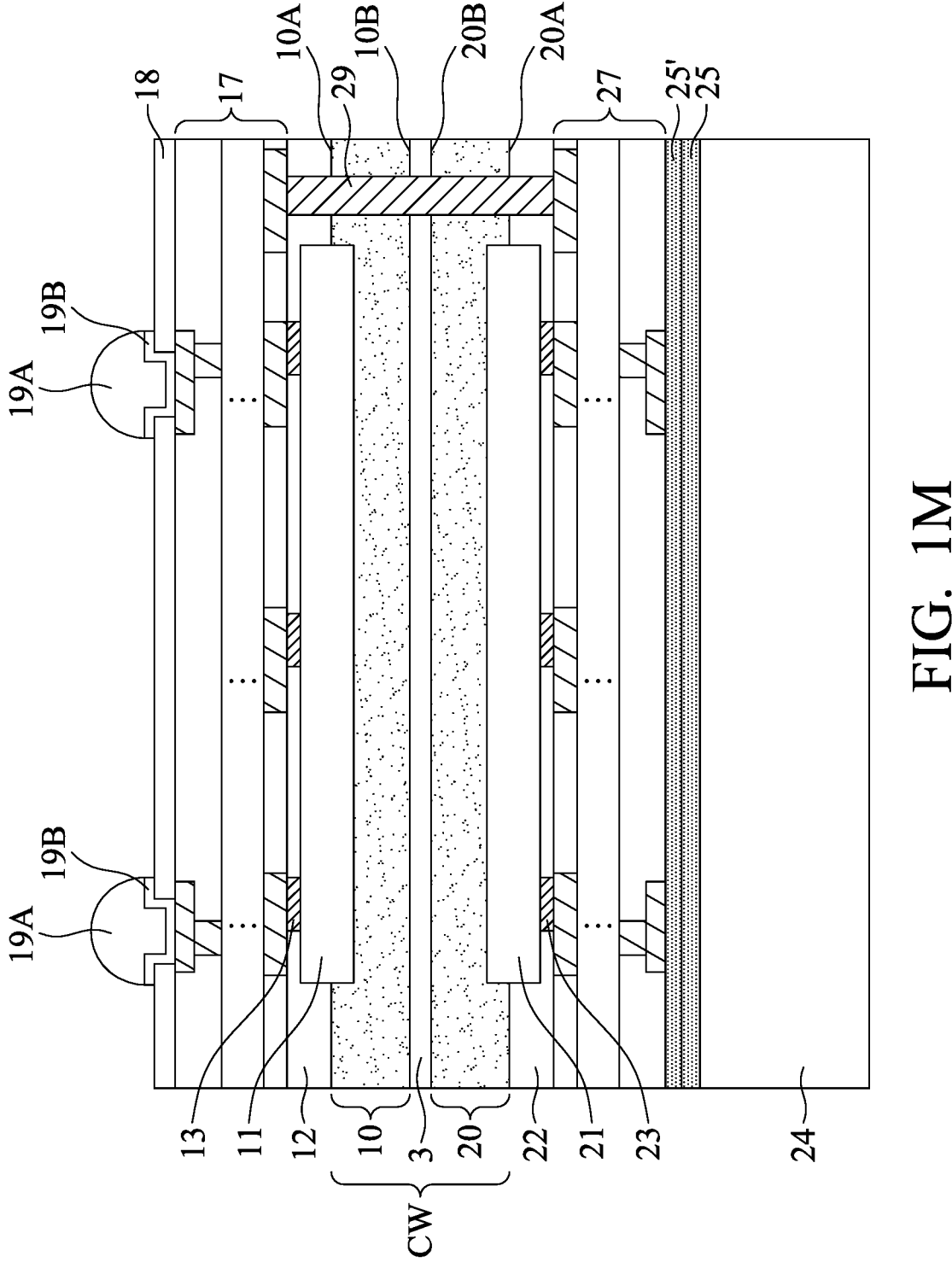
Figure 1N:
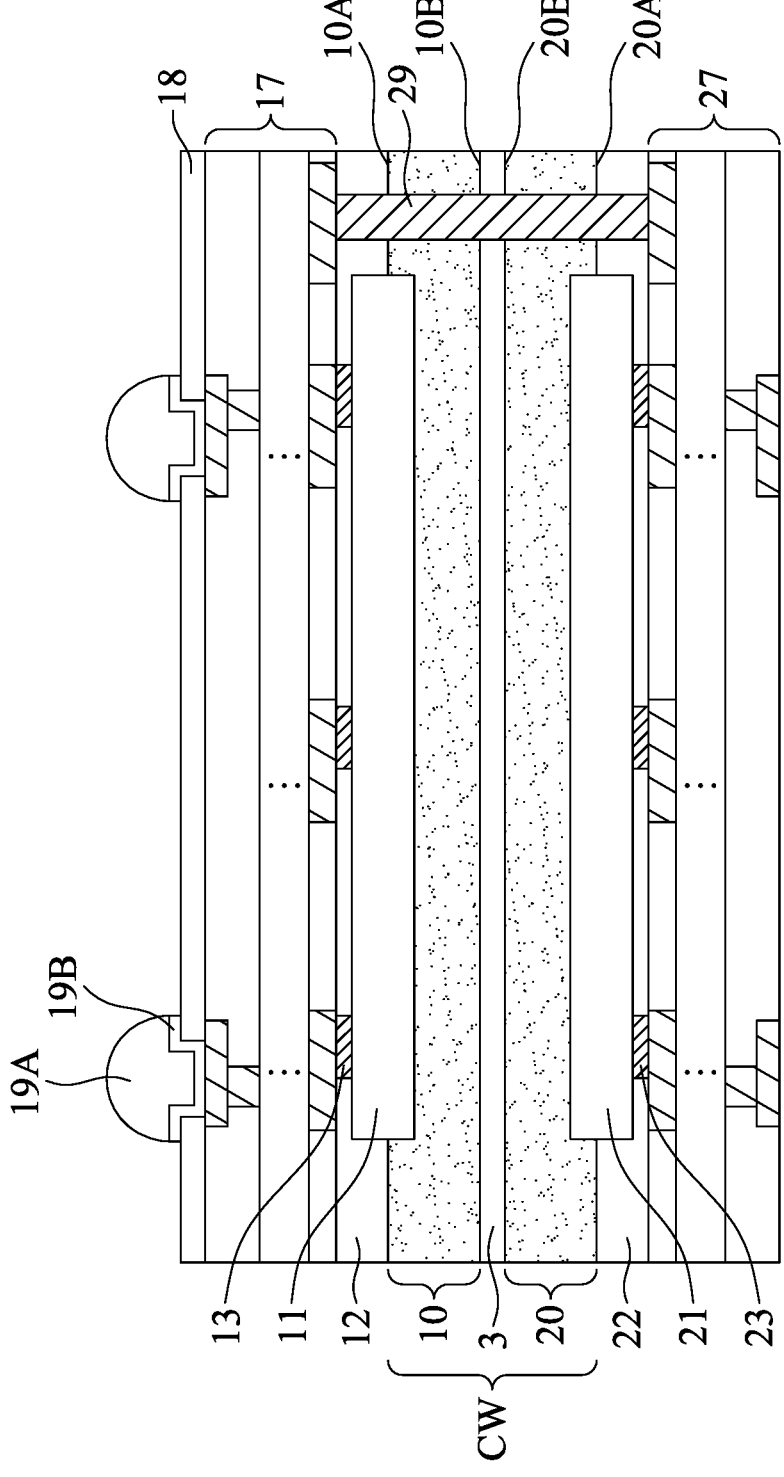

FIG. 1M illustrates the formation of a polymer layer 18 over the interconnect structure 17. The polymer layer 18 is then patterned to have a plurality of openings (not shown) exposing the underlying contact pads of the interconnection structure 17. The polymer layer 18 may be formed of polyimide, polybenzoxazole (PBO), or the like.

FIG. 1M also illustrates the formation of conductive connectors 19A and under-bump metallurgies (UBMs) 19B for external connections. The conductive connectors 19A and the UBMs 19B are formed over the polymer layer 18 and in the openings of polymer layer 18 to connect the exposed contact pads of the interconnection structure 17. The respective process is illustrated as process 312 in the process flow 300 as shown in FIG. 3B. In accordance with some embodiments, each of the UBMs 19B includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in the UBMs 19B.

The formation process of the UBMs 19B and the conductive connectors 19A may include depositing a blanket UBM layer, forming and patterning a mask (which may be a photoresist layer, not shown), with portions of the blanket UBM layer being exposed through the opening in the mask. After the formation of the UBMs 19B, the illustrated package is placed into a plating solution (not shown), and a plating process is performed to form conductive connectors 19A on the UBMs 19B. In accordance with some embodiments, the conductive connectors 19A include non-solder parts (not shown), which are not molten in the subsequent reflow processes. The non-solder parts may be formed of copper, and hence are referred to as copper bumps hereinafter, although they may be formed of other non-solder materials. Each of the conductive connectors 19A may also include cap layer(s) (not shown) selected from a nickel layer, a nickel alloy, a palladium layer, a gold layer, a silver layer, or multi-layers thereof. The cap layer(s) are formed over the copper bumps. The conductive connectors 19A may further include solder caps, which may be formed of a Sn—Ag alloy, a Sn—Cu alloy, a Sn—Ag—Cu alloy, or the like, and may be lead-free or lead-containing.

FIG. 1N illustrates the removal of the carrier 24. The respective process is illustrated as process 313 in the process flow 300 as shown in FIG. 3B. The carrier 24 may be removed in a similar manner to the removal of the carrier 14 illustrated in FIG. 1J after the formation of the external conductive connectors 19A. After the carrier 24 have been removed, the exposed de-bonding layer (if any) and oxide-to-oxide structure (e.g., oxide layers 25 and 25' shown in FIG. 1M) may be removed or peeled by dry etching, wet etching, CMP process, other suitable removal processes, and/or a combination thereof. As a result, the formation of the resulting wafer-to-wafer bonding structure/package fabricated by the processes shown in FIGS. 1A to 1N is completed.

Figure 2:
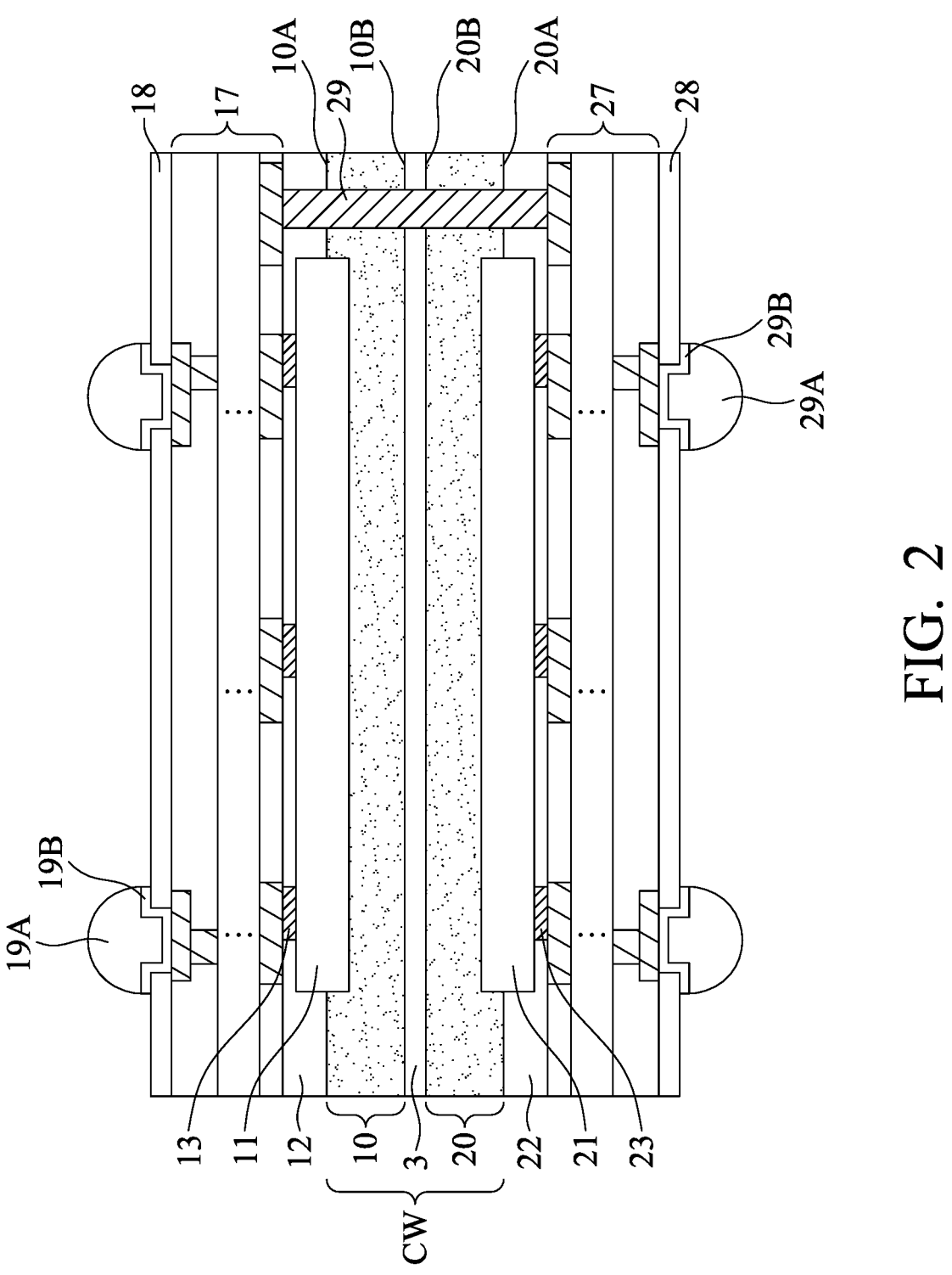
FIG. 2 illustrates a cross-sectional view of a wafer-to-wafer bonding structure in accordance with some other embodiments of the present disclosure.

FIG. 2 illustrates a cross-sectional view of a wafer-to-wafer bonding structure/package in accordance with some other embodiments of the present disclosure. Compared with the embodiments shown in FIG. 1N, the wafer-to-wafer bonding structure/package of FIG. 2 further includes a polymer layer 28 formed below the interconnection structure 27, and conductive connectors 29A and under-bump metallurgies (UBMs) 29B formed below the polymer layer 28 and in the openings (not shown) of polymer layer 28 to connect the exposed contact pads of the interconnection structure 27. That is, the conductive connectors (19A, 29A) and UBMs (19B, 29B) can also be formed on both sides of the package, as shown in FIG. 2. The polymer layer 28, conductive connectors 29A and UBMs 29B may be the same as or similar to the polymer layer 18, conductive connectors 19A and UBMs 19B illustrated in FIG. 1M, and the details are not repeated here. It should be understood that the polymer layer 18, conductive connectors 19A and UBMs 19B may also be omitted in different embodiments.

In summary, the embodiments of the present disclosure have some advantageous features. First and second wafers are first bonded by fusion/oxide bonding rather than metal-to-metal bonding or hybrid bonding that requires higher pressure and higher temperature. After the first and second wafers are bonded together, the thickness of the first wafer is reduced using an ion implantation and separation approach in silicon-on-insulator (SOI) technology, and the second wafer is thinned by a removal process such as trimming or grinding. The manufacturing process is simplified as it does not require two thinning processes (one for the first wafer and one for the second wafer) during package fabrication. After the first devices are formed on the first wafer, a carrier is attached over the first wafer, and an (optical) alignment process is performed from the bottom of the second wafer to align the active regions of the second wafer for placement of the second devices with the active regions of the first wafer for placement of the first devices. The second devices are then formed in the active regions of the second wafer. This provides better overlay control due to the reduced distance that the light has to travel in the wafers. As a result, process yield is improved, and product performance and reliability are also improved. Furthermore, a via connection structure is then formed through the first wafer, the second wafer and the insulation layer therebetween to connect the first devices to the second devices on the two sides of the insulation layer, thereby realizing the intended function of the wafer-on-wafer stacking structure. The first devices and the second devices can be the same type or different types in various embodiments.

In accordance with some embodiments, a method of forming a semiconductor structure is provided. The method includes obtaining a composite wafer that includes a substrate, an insulation layer on the substrate, and a first active layer on the insulation layer. The method also includes implanting ions into the substrate to form an etch stop layer in the substrate. The method also includes forming a first device on the top surface of the first active layer. The method also includes attaching a first carrier over the first device with a first oxide-to-oxide bonding structure. The method also includes thinning the substrate to expose a second active layer that was originally between the insulation layer and the etch stop layer. The method also includes performing an alignment process on the bottom surface of the second active layer, wherein the bottom surface of the second active layer and the top surface of the first active layer are at opposite sides of the insulation layer. The method also includes forming a second device on the bottom surface of the second active layer, and a second interconnection structure below and coupled to the second device. The method also includes attaching a second carrier to the second interconnection structure with a second oxide-to-oxide bonding structure. The method also includes removing the first carrier and the first oxide-to-oxide bonding structure. The method also includes forming a via cavity through the first active layer, through the insulation layer, through the second active layer, and to one conductive feature of the second interconnection structure. The method also includes filling the via cavity with a metal material to form a via structure. In addition, the method includes forming a first interconnection structure over and coupled to the first device, wherein the via structure connects the first device to the second device.

In accordance with some embodiments, a method of forming a semiconductor structure is provided. The method includes obtaining a composite wafer that includes a substrate, an insulation layer on the substrate, and a first active layer on the insulation layer, wherein an etch stop layer is formed in the substrate at a distance from the bottom surface of the substrate. The method also includes forming a first device in a first active region on the top surface of the first active layer. The method also includes forming a first oxide layer over the first device and the first active layer. The method also includes forming a second oxide layer over a first carrier, and attaching the first carrier over the first device through a bonding of the first oxide layer and the second oxide layer. The method also includes removing the portion of the substrate under the etch stop layer and removing the etch stop layer so that the remaining portion of the substrate under the insulation layer forms a second active layer. The method also includes obtaining the position of the first active region of the first active layer using an optical alignment method from the bottom surface of the second active layer, and determining the position of a second active region on the bottom surface of the second active layer using the optical alignment method, wherein the second active region is aligned with the first active region. The method also includes forming a second device in the second active region on the bottom surface of the second active layer, and a second interconnection structure below and coupled to the second device. The method also includes forming a third oxide layer below the second interconnection structure. The method also includes forming a fourth oxide layer over a second carrier, and attaching the second carrier to the second interconnection structure through a bonding of the third oxide layer and the fourth oxide layer. The method also includes removing the first carrier, the first oxide layer, and the second oxide layer. The method also includes forming a via cavity through the first active layer, through the insulation layer, through the second active layer, and to one conductive feature of the second interconnection structure. The method also includes filling the via cavity with a metal material to form a via structure. In addition, the method includes forming a first interconnection structure over and coupled to the first device, wherein the via structure connects the first device to the second device.

In accordance with some embodiments, a semiconductor device is provided. The semiconductor structure includes a first wafer having a first active surface and a first back surface. The semiconductor structure also includes a second wafer having a second active surface and a second back surface, wherein the first wafer is stacked on the second wafer. The semiconductor structure also includes an insulation layer sandwiched between and in contact with the first back surface and the second back surface to isolate the first wafer and the second wafer. The semiconductor structure also includes a first device formed on the first active surface. The semiconductor structure also includes a first interconnection structure formed over and coupled to the first device. The semiconductor structure also includes a second device formed on the second active surface. The semiconductor structure also includes a second interconnection structure formed below and coupled to the second device. In addition, the semiconductor structure includes a via structure extending through the first wafer, through the insulation layer, and through the second wafer to connect the first interconnection structure to the second interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
   obtaining a composite wafer comprising a substrate, an insulation layer on the substrate, and a first active layer on the insulation layer, wherein obtaining the composite wafer comprises:
      providing a first wafer and a second wafer, wherein an oxide layer is formed around the first wafer;
      implanting hydrogen ions into the first wafer to embrittle the first wafer beneath the oxide layer;
      bonding the first wafer to the second wafer through the oxide layer; and
      after bonding the first wafer to the second wafer, splitting the first wafer at a peak location of the implanted hydrogen ions by using an annealing process, wherein a remaining portion of the first wafer forms the first active layer of the composite wafer, the oxide layer forms the insulation layer of the composite wafer, and the second wafer forms the substrate of the composite wafer;
   implanting ions into the substrate to form an etch stop layer in the substrate;
   forming a first device on a top surface of the first active layer;
   attaching a first carrier over the first device with a first oxide-to-oxide bonding structure;
   thinning the substrate to expose a second active layer that was originally between the insulation layer and the etch stop layer;
   performing an alignment process on a bottom surface of the second active layer, the bottom surface of the second active layer and the top surface of the first active layer being at opposite sides of the insulation layer;
   forming a second device on the bottom surface of the second active layer, and a second interconnection structure below and coupled to the second device;

attaching a second carrier to the second interconnection structure with a second oxide-to-oxide bonding structure;
   removing the first carrier and the first oxide-to-oxide bonding structure;
   forming a via cavity through the first active layer, through the insulation layer, through the second active layer, and to one conductive feature of the second interconnection structure;
   filling the via cavity with a metal material to form a via structure; and
   forming a first interconnection structure over and coupled to the first device, wherein the via structure connects the first device to the second device.

2. The method as claimed in claim 1, wherein:
   the first active layer has a first back surface opposite the top surface of the first active layer,
   the second active layer has a second back surface opposite the bottom surface of the second active layer, and
   the insulation layer is located between and in contact with the first back surface and the second back surface to isolate the first device formed on the first active layer and the second device formed on the second active layer.

3. The method as claimed in claim 1, wherein implanting the ions into the substrate to form the etch stop layer is performed after bonding the first wafer to the second wafer.

4. The method as claimed in claim 1, wherein the etch stop layer comprises silicon germanium (SiGe), and the ions implanted into the substrate to form the etch stop layer include germanium ions.

5. The method as claimed in claim 1, wherein thinning the substrate comprises:
   removing a portion of the substrate under the etch stop layer; and
   removing the etch stop layer so that a remaining portion of the substrate constitutes the second active layer and the bottom surface of the second active layer is exposed.

6. The method as claimed in claim 1, further comprising:
   forming a first oxide layer over the first device on the top surface of the first active layer;
   forming a second oxide layer over the first carrier; and
   placing the first carrier over the first device so that the first oxide layer is in contact with the second oxide layer to form the first oxide-to-oxide bonding structure.

7. The method as claimed in claim 6, further comprising:
   forming a de-bonding layer over the first carrier before the second oxide layer is formed over the first carrier; and
   decomposing the de-bonding layer before the first carrier and the first oxide-to-oxide bonding structure are removed from the first device.

8. The method as claimed in claim 1, wherein performing the alignment process on the bottom surface of the second active layer comprises:
   obtaining a position of a first active region on the top surface of the first active layer using an optical method from the bottom surface of the second active layer, which comprises emitting a light passing through the second active layer, the insulation layer and the first active layer to reach the top surface of the first active layer, and then receiving a reflected light form the top surface of the first active layer; and
   determining a position of a second active region on the bottom surface of the second active layer using the optical method, wherein the second active region is aligned with the first active region, and wherein the first device is formed in the first active region and the second device is formed in the second active region.

9. The method as claimed in claim 1, further comprising:

forming a third oxide layer on the second interconnection structure;

forming a fourth oxide layer over the second carrier; and placing the second carrier under the second interconnection structure so that the third oxide layer is in contact with the fourth oxide layer to form the second oxide-to-oxide bonding structure.

10. The method as claimed in claim 1, further comprising:

forming a polymer layer over the first interconnection structure, wherein the polymer layer has a plurality of openings exposing contact pads of the first interconnection structure; and forming a plurality of conductive connectors over the polymer layer and in the openings to connect the contact pads.

11. The method as claimed in claim 1, further comprising:

removing the second carrier and the second oxide-to-oxide bonding structure from the second interconnection structure;

forming a polymer layer below the second interconnection structure, wherein the polymer layer has a plurality of openings exposing contact pads of the second interconnection structure; and forming a plurality of conductive connectors below the polymer layer and in the openings to connect the contact pads.

12. The method as claimed in claim 1, wherein the first device or the second device comprises a metal-oxide-semiconductor field-effect transistor (MOSFET), a fin field-effect transistor (FinFET), a gate-all-around field-effect transistor (GAAFET), a diode, a capacitor, a resistor, or an inductor.

13. The method as claimed in claim 1, wherein the via cavity is formed after removing the first carrier and the first oxide-to-oxide bonding structure.

14. A method of forming a semiconductor structure, the method comprising:

obtaining a composite wafer comprising a substrate, an insulation layer on the substrate, and a first active layer on the insulation layer, wherein an etch stop layer is formed in the substrate at a distance from a bottom surface of the substrate;

forming a first device in a first active region on a top surface of the first active layer;

forming a first oxide layer over the first device and the first active layer;

forming a second oxide layer over a first carrier, and attaching the first carrier over the first device through a bonding of the first oxide layer and the second oxide layer;

removing a portion of the substrate under the etch stop layer and removing the etch stop layer so that a remaining portion of the substrate under the insulation layer forms a second active layer;

obtaining a position of the first active region of the first active layer using an optical alignment method from a bottom surface of the second active layer, which comprises emitting a light passing through the second active layer, the insulation layer and the first active layer to reach the top surface of the first active layer, and then receiving a reflected light form the top surface of the first active layer, and determining a position of a second active region on the bottom surface of the second active layer using the optical alignment method, wherein the second active region is aligned with the first active region;

forming a second device in the second active region on the bottom surface of the second active layer, and a second interconnection structure below and coupled to the second device;

forming a third oxide layer below the second interconnection structure;

forming a fourth oxide layer over a second carrier, and attaching the second carrier to the second interconnection structure through a bonding of the third oxide layer and the fourth oxide layer;

removing the first carrier, the first oxide layer, and the second oxide layer;

forming a via cavity through the first active layer, through the insulation layer, through the second active layer, and to one conductive feature of the second interconnection structure;

filling the via cavity with a metal material to form a via structure; and forming a first interconnection structure over and coupled to the first device, wherein the via structure connects the first device to the second device.

15. The method as claimed in claim 14, further comprising:

forming a first inter-layer dielectric (ILD) layer covering the first device prior to forming the first oxide layer; and forming a second inter-layer dielectric layer covering the second device prior to forming the third oxide layer.

16. The method as claimed in claim 15, wherein the via structure also passes through the first inter-layer dielectric layer and the second inter-layer dielectric layer.

17. The method as claimed in claim 14, further comprising:

forming a polymer layer over the first interconnection structure, wherein the polymer layer has a plurality of openings exposing contact pads of the first interconnection structure; and forming a plurality of conductive connectors over the polymer layer and in the openings to connect the contact pads.

18. A method of forming a semiconductor structure, the method comprising:

obtaining a composite wafer comprising a substrate, an insulation layer on the substrate, and a first active layer on the insulation layer, wherein obtaining the composite wafer comprises:

providing a first wafer and a second wafer, wherein an oxide layer is formed around the first wafer;

implanting hydrogen ions into the first wafer to embrittle the first wafer beneath the oxide layer;

bonding the first wafer to the second wafer through the oxide layer; and after bonding the first wafer to the second wafer, splitting the first wafer at a peak location of the implanted hydrogen ions by using an annealing process, wherein a remaining portion of the first wafer forms the first active layer of the composite wafer, the oxide layer forms the insulation layer of the composite wafer, and the second wafer forms the substrate of the composite wafer;

implanting ions into the substrate to form an etch stop layer in the substrate;

forming a first device on a top surface of the first active layer;

attaching a first carrier over the first device;

removing a portion of the substrate under the etch stop layer and removing the etch stop layer so that a remaining portion of the substrate under the insulation layer forms a second active layer;

forming a second device on a bottom surface of the second active layer, and a second interconnection structure below and coupled to the second device;

attaching a second carrier over the second interconnection structure;

removing the first carrier;

forming a via structure extending through the first active layer, the insulation layer and the second active layer and coupled to one conductive feature of the second interconnection structure; and forming a first interconnection structure over and coupled to the first device, wherein the via structure connects the first interconnection structure and the second interconnection structure.

19. The method as claimed in claim 18, further comprising:

performing an alignment process, comprising:

obtaining a position of a first active region on the top surface of the first active layer using an optical method from the bottom surface of the second active layer, which comprises emitting a light passing through the second active layer, the insulation layer and the first active layer to reach the top surface of the first active layer, and then receiving a reflected light form the top surface of the first active layer; and determining a position of a second active region on the bottom surface of the second active layer using the optical method, wherein the second active region is aligned with the first active region, and wherein the first device is formed in the first active region and the second device is formed in the second active region.

20. The method as claimed in claim 18, wherein:

the first active layer has a first back surface opposite the top surface of the first active layer, the second active layer has a second back surface opposite the bottom surface of the second active layer, and the insulation layer is located between and in contact with the first back surface and the second back surface to isolate the first device formed on the first active layer and the second device formed on the second active layer.

* * * * *